(12) United States Patent
Cui

(10) Patent No.: US 10,461,138 B2
(45) Date of Patent: Oct. 29, 2019

(54) ORGANIC LIGHT-EMITTING DISPLAY DEVICE AND MANUFACTURING METHOD THEREOF

(71) Applicant: BOE TECHNOLOGY GROUP CO., LTD., Beijing (CN)

(72) Inventor: Ying Cui, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/987,521

(22) Filed: May 23, 2018

(65) Prior Publication Data
US 2019/0035865 A1 Jan. 31, 2019

(30) Foreign Application Priority Data
Jul. 31, 2017 (CN) .......................... 2017 1 0646379

(51) Int. Cl.
*H01L 27/32* (2006.01)
*H01L 51/50* (2006.01)
(Continued)

(52) U.S. Cl.
CPC .......... *H01L 27/3246* (2013.01); *H01L 51/00* (2013.01); *H01L 51/5056* (2013.01);
(Continued)

(58) Field of Classification Search
USPC .............................................. 257/93; 438/22
See application file for complete search history.

(56) References Cited

U.S. PATENT DOCUMENTS 6,608,331 B2 * 8/2003 Duineveld .......... H01L 27/3246
257/350
7,932,109 B2 4/2011 Hayata et al.
(Continued)

FOREIGN PATENT DOCUMENTS

CN 101766058 A 6/2010
CN 103681744 A 3/2014
(Continued)

OTHER PUBLICATIONS

Chinese Office Action in Chinese Application No. 201710646379.7, dated Jun. 20, 2019 with English translation.

*Primary Examiner* — David Vu
*Assistant Examiner* — Brandon C Fox
(74) *Attorney, Agent, or Firm* — Collard & Roe, P.C.

(57) ABSTRACT

An organic light-emitting display device and a manufacturing method thereof are provided by the embodiments of the present disclosure, and the organic light-emitting display device includes: a substrate; a plurality of pixel definition strips disposed on the substrate, in which the plurality of pixel definition strips are spaced apart from and arranged in parallel with each other, and two adjacent pixel definition strips among the plurality of pixel definition strips and a portion of the substrate between the two adjacent pixel definition strips constitute a pixel definition groove; and an organic light-emitting functional layer disposed in the pixel definition groove, the organic light-emitting functional layer includes a plurality of sub organic light-emitting functional layers which are insulated with each other and arranged along an extension direction of the plurality of pixel definition strips.

20 Claims, 6 Drawing Sheets

(51) Int. Cl.
  *H01L 51/52* (2006.01)
  *H01L 51/00* (2006.01)
  *H01L 51/56* (2006.01)

(52) U.S. Cl.
  CPC ...... *H01L 51/5072* (2013.01); *H01L 51/5092* (2013.01); *H01L 51/5206* (2013.01); *H01L 51/5221* (2013.01); *H01L 51/56* (2013.01)

(56) References Cited

U.S. PATENT DOCUMENTS

| | | | |
|---|---|---|---|
| 9,716,252 B2 | 7/2017 | Kim et al. | |
| 2002/0090579 A1* | 7/2002 | Chung | H01L 27/3283 430/321 |
| 2005/0052120 A1* | 3/2005 | Gupta | H01L 27/3283 313/503 |
| 2016/0380035 A1 | 12/2016 | Cho et al. | |

FOREIGN PATENT DOCUMENTS

| | | |
|---|---|---|
| CN | 105914223 A | 8/2016 |
| CN | 106129101 A | 11/2016 |
| CN | 106298847 A | 1/2017 |

\* cited by examiner

ORGANIC LIGHT-EMITTING DISPLAY DEVICE AND MANUFACTURING METHOD THEREOF

The present application claims the priority of the Chinese Patent Application No. 201710646379.7 filed on Jul. 31, 2017, which is incorporated herein by reference as part of the disclosure of the present application.

TECHNICAL FIELD

Embodiments of the present disclosure relate to an organic light-emitting display device and a manufacturing method thereof.

BACKGROUND

Compared with liquid crystal displays, organic light-emitting display devices have many advantages, such as self luminescence, all solid state, wide angle of view, fast response and so on, the organic light-emitting display devices are considered to have a great application prospect in the field of display and have been widely used in mobile phones, digital cameras, personal digital assistants (PDA) and notebook computers.

Each of the organic light-emitting display devices includes a plurality of pixel units, and each of the pixel units comprises a switching transistor, a driving transistor and an organic light-emitting diode (OLED). The OLED is a current mode light-emitting device, which mainly includes anode, cathode and organic material functional layer. A main work principle of the OLED is that carriers driven by electric field formed by the anode and the cathode are injected into the organic material functional layer and recombine in the organic material functional layer to emit light.

SUMMARY

At least one embodiment of the present disclosure provides an organic light-emitting display device and a manufacturing method thereof, a uniformity of a thickness of an organic light-emitting functional layer in the organic light-emitting display device is improved, and display effect of the organic light-emitting display device is improved.

At least one embodiment of the present disclosure provides an organic light-emitting display device, and the organic light-emitting display device comprises: a substrate; a plurality of pixel definition strips disposed on the substrate, wherein the plurality of pixel definition strips are spaced apart from and arranged in parallel with each other, and two adjacent pixel definition strips among the plurality of pixel definition strips and a portion of the substrate between the two adjacent pixel definition strips constitute a pixel definition groove; and an organic light-emitting functional layer disposed in the pixel definition groove, wherein the organic light-emitting functional layer comprises a plurality of sub organic light-emitting functional layers which are insulated with each other and arranged along an extension direction of the plurality of pixel definition strips.

For example, in the organic light-emitting display device provided by at least one embodiment of the present disclosure, the organic light-emitting functional layer comprises the plurality of sub organic light-emitting functional layers and at least one insulation portion which are alternately arranged along the extension direction of the plurality of pixel definition strips, and the plurality of sub organic light-emitting functional layers are insulated with each other by the at least one insulation portion.

For example, in the organic light-emitting display device provided by at least one embodiment of the present disclosure, the plurality of sub organic light-emitting functional layers and the at least one insulation portion are arranged at a same layer.

For example, in the organic light-emitting display device provided by at least one embodiment of the present disclosure, upper surfaces of the plurality of sub organic light-emitting functional layers facing away from the substrate and upper surface of the at least one insulation portion facing away from the substrate are arranged in a same plane.

For example, in the organic light-emitting display device provided by at least one embodiment of the present disclosure, distances between the two adjacent pixel definition strips are equal to each other or not equal to each other.

For example, in the organic light-emitting display device provided by at least one embodiment of the present disclosure, a plurality of first electrodes, which are spaced apart from each other and arranged along the extension direction of the plurality of pixel definition strips, are disposed in the pixel definition groove, and the plurality of first electrodes are arranged between the substrate and the organic light-emitting functional layer.

For example, in the organic light-emitting display device provided by at least one embodiment of the present disclosure, among the plurality of first electrodes, distances between two adjacent first electrodes along the extension direction of the plurality of pixel definition strips are equal to each other or not equal to each other.

For example, in the organic light-emitting display device provided by at least one embodiment of the present disclosure, the plurality of first electrodes correspond with the plurality of sub organic light-emitting functional layers in a one-to-one manner.

For example, the organic light-emitting display device provided by at least one embodiment of the present disclosure further comprises: a second electrode disposed on the plurality of sub organic light-emitting functional layers, and the second electrode is shared by the plurality of sub organic light-emitting functional layers.

For example, in the organic light-emitting display device provided by at least one embodiment of the present disclosure, the at least one insulation portion and the plurality of pixel definition strips are made of different materials.

For example, the organic light-emitting display device provided by at least one embodiment of the present disclosure comprises a plurality of sub-pixels arranged in a matrix, and the pixel definition groove corresponds to a row of the sub-pixels or a column of the sub-pixels, each of the plurality of sub organic light-emitting functional layers corresponds to one of the sub-pixels.

At least one embodiment of the present disclosure further provides method for manufacturing an organic light-emitting display device, and the method comprises: providing a substrate; forming a plurality of pixel definition strips on the substrate, wherein the plurality of pixel definition strips are spaced apart from and arranged in parallel with each other; two adjacent pixel definition strips among the plurality of pixel definition strips and a portion of the substrate between the two adjacent pixel definition strips constitute a pixel definition groove; and forming an organic light-emitting functional layer in the pixel definition groove, wherein the organic light-emitting functional layer comprises a plurality of sub organic light-emitting functional layers which are insulated with each other and arranged along an extension direction of the plurality of pixel definition strips.

For example, in the method for manufacturing the organic light-emitting display device provided by at least one embodiment of the present disclosure, forming the organic light-emitting functional layer comprises: forming an organic light-emitting functional film in the pixel definition groove; illuminating a first portion of the organic light-emitting functional film by ultraviolet light to form at least one insulation portion, wherein a second portion of the organic light-emitting functional film without being illuminated by the ultraviolet light is the plurality of sub organic light-emitting functional layers.

For example, in the method for manufacturing the organic light-emitting display device provided by at least one embodiment of the present disclosure, the organic light-emitting functional layer comprises the plurality of sub organic light-emitting functional layers and the at least one insulation portion which are alternately arranged along the extension direction of the plurality of pixel definition strips, and the plurality of sub organic light-emitting functional layers are insulated with each other by the at least one insulation portion.

For example, in the method for manufacturing the organic light-emitting display device provided by at least one embodiment of the present disclosure, before forming the organic light-emitting functional layer, the method further comprises: forming a plurality of first electrodes spaced apart from each other and arranged along the extension direction of the plurality of pixel definition strips in the pixel definition groove.

For example, in the method for manufacturing the organic light-emitting display device provided by at least one embodiment of the present disclosure, the plurality of first electrodes correspond with the plurality of sub organic light-emitting functional layers in a one-to-one manner.

For example, in the method for manufacturing the organic light-emitting display device provided by at least one embodiment of the present disclosure, the organic light-emitting functional layer comprises an organic light-emitting layer, forming the organic light-emitting layer comprises: injecting ink comprising a material of the organic light-emitting layer in the pixel definition groove by an ink-jet printing process.

For example, in the method for manufacturing the organic light-emitting display device provided by at least one embodiment of the present disclosure, before forming the at least one insulation portion, the method further comprises: curing the organic light-emitting functional film by a curing process, wherein the curing process comprises a vacuum curing process and/or a heat curing process.

For example, in the method for manufacturing the organic light-emitting display device provided by at least one embodiment of the present disclosure, the organic light-emitting display device comprises a plurality of sub-pixels arranged in a matrix, the pixel definition groove corresponds to a row of the sub-pixels or a column of the sub-pixels, and each of the plurality of sub organic light-emitting functional layers corresponds to one of the sub-pixels.

For example, the method for manufacturing the organic light-emitting display device provided by at least one embodiment of the present disclosure further comprises: forming a second electrode for covering the plurality of sub organic light-emitting functional layers, wherein the second electrode is shared by the plurality of sub organic light-emitting functional layers.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the present disclosure and thus are not limitative of the present disclosure, for those skilled in the art, other drawings may also be obtained without any creative labor.

Figure 1:
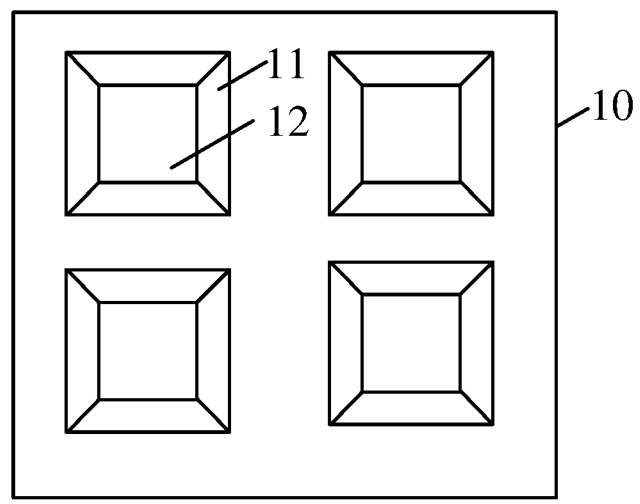
FIG. 1 is a schematic diagram of a plane structure of a substrate with a pixel definition layer provided thereon.

REFERENCE NUMERALS 2-organic light-emitting display device; 10,20-substrate; 11-pixel definition layer; 12-opening; 23'-organic light-emitting functional film; 13,23-organic light-emitting functional layer; 231-sub organic light-emitting functional layer; 232-insulation portion; 21-pixel definition strip; 22-pixel definition groove; 24-first electrode; 25-second electrode; 27-sub-pixel.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

The sizes of the patterns in the organic light-emitting display device involved in the present disclosure are usually micron or smaller in the actual product. For the sake of clarity, the sizes of the structures in the drawings in the present disclosure are magnified, unless otherwise specified, they do not represent the actual sizes and proportions.

Figure 2:
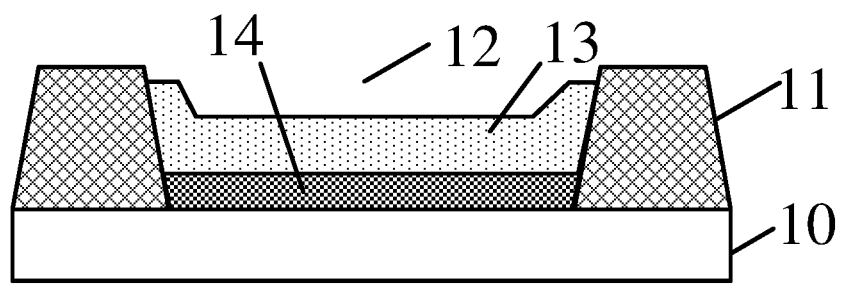
FIG. 2 is a sectional view of a partial structure of the substrate with an organic light-emitting layer provided thereon.

An organic light-emitting functional layer is usually produced by an ink-jet printing technology, for example, FIG. 1 is a schematic diagram of a plane structure of a substrate with a pixel definition layer provided thereon, FIG. 2 is a sectional view of a partial structure of the substrate with an organic light-emitting layer provided thereon. As illustrated in FIG. 1 and FIG. 2, first, a pixel definition layer 11 is made on a substrate 10 provided with a first electrode 14, the pixel definition layer 11 is provided with openings 12 which are correspond with pixel areas on the substrate 10 in a one-to-one manner, and then ink used for ink-jet printing is sprayed into the openings 12 of the pixel definition layer 11 by the ink-jet printing process to form an organic light-emitting functional layer 13.

However, as illustrated in FIG. 2, the ink sprayed into the openings 12 appears to climb along the pixel definition layer 11 around the openings 12 in the process of curing the ink, thus the organic light-emitting functional layer 13 with a thick edge portion and a thin middle portion is formed, that is a thickness of the formed organic light-emitting functional layer 13 is uneven, which affects a display effect of the organic light-emitting display device.

Figure 3:
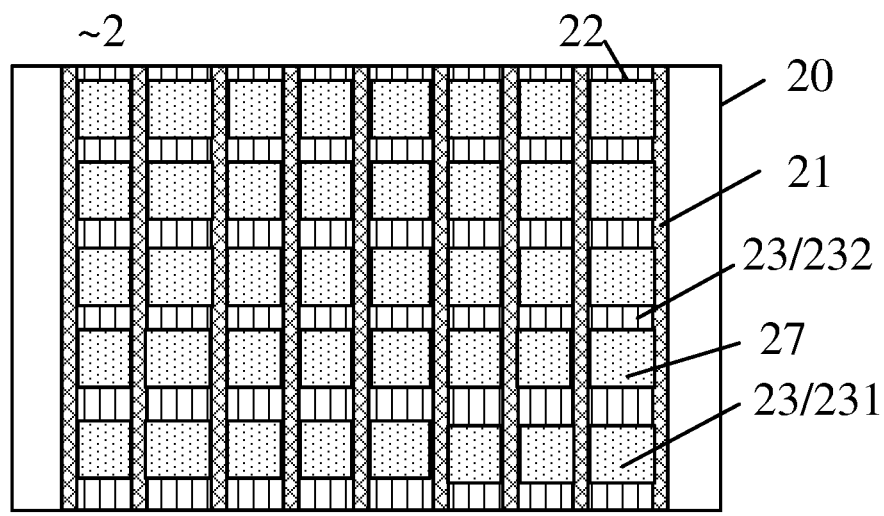
FIG. 3 is a schematic diagram of a plane structure of an organic light-emitting display device provided by at least one embodiment of the present disclosure.

At least one embodiment of the present disclosure provides an organic light-emitting display device, for example, FIG. 3 is a schematic diagram of a plane structure of the organic light-emitting display device provided by at least one embodiment of the present disclosure. As illustrated in FIG. 3, the organic light-emitting display device 2 comprises: a substrate 20; a plurality of pixel definition strips 21 disposed on the substrate 20, the plurality of pixel definition strips 21 being spaced apart from and arranged in parallel with each other, and two adjacent pixel definition strips 21 among the plurality of pixel definition strips 21 and a portion of the substrate 20 between the two adjacent pixel definition strips 21 constituting a pixel definition groove 22; and an organic light-emitting functional layer 23 disposed in the pixel definition groove 22, in which the organic light-emitting functional layer 23 comprises a plurality of sub organic light-emitting functional layers 231 which are insulated with each other and arranged along an extension direction of the plurality of pixel definition strips 21. The organic light-emitting display device improves the uniformity of the thickness of the organic light-emitting functional layer 23 in the organic light-emitting display device and improves the display effect of the organic light-emitting display device.

For example, as illustrated in FIG. 3, the organic light-emitting functional layer 23 comprises the plurality of sub organic light-emitting functional layers 231 and at least one insulation portion 232 which are alternately arranged along the extension direction of the plurality of pixel definition strips 21. For example, there are a plurality of insulation portions 232, and the plurality of sub organic light-emitting functional layers 231 are insulated with each other by the plurality of insulation portions 232. That is, the plurality of insulation portions 232 spaced apart from each other in the organic light-emitting functional layer 23 separate the plurality of sub organic light-emitting functional layers 231 from each other, to form light-emitting areas which are spaced apart from each other.

For example, as illustrated in FIG. 3, the plurality of sub organic light-emitting functional layers 231 and the plurality of insulation portions 232 are arranged at a same layer. It should be noted that, both the initial material of the plurality of sub organic light-emitting functional layers 231 and the initial material of the plurality of insulation portions 232 are a same organic light-emitting functional material. The formation process of the plurality of sub organic light-emitting functional layers 231 and the plurality of insulation portions 232 is: coating an organic light-emitting functional film in the pixel definition groove 22, and then modifying a portion of the organic light-emitting functional film. For example, the modification includes illuminating a portion of the organic light-emitting functional film by ultraviolet light to form the plurality of insulation portions 232; and correspondingly, a portion of the organic light-emitting functional film which is not modified (for example, which is not illuminated by the ultraviolet light) forms the plurality of sub organic light-emitting functional layers 231. Although one possible situation is that the surfaces of the plurality of sub organic light-emitting functional layers 231 and the surfaces of the plurality of insulation portions 232 close to the substrate 20 are not in a same plane, it is also considered that the plurality of sub organic light-emitting functional layers 231 and the plurality of insulation portions 232 are arranged at a same layer.

For example, as illustrated in FIG. 3, upper surfaces of the plurality of sub organic light-emitting functional layers 231 facing away from the substrate and upper surfaces of the plurality of insulation portions 232 facing away from the substrate are arranged in a same plane. In this way, in a pixel definition groove 22, there is no segment difference among the plurality of sub organic light-emitting functional layers 231 and the plurality of insulation portions 232, so that the ink in the pixel definition groove 22 only climbs along the plurality of pixel definition strips on both sides of the pixel definition groove, and there is no climbing phenomenon along the extension direction of the plurality of pixel definition strips 21, therefore, in the formed organic light-emitting functional layer, only the edge of the organic light-emitting functional layer parallel to the extension direction of the plurality of pixel definition strips has a thickness difference with the middle region of the organic light-emitting functional layer; in this way, after the organic light-emitting functional layer is patterned, in the plurality of sub organic light-emitting functional layers 231, only the edge of the organic light-emitting functional layer parallel to the extension direction of the plurality of pixel definition strips has a thickness difference with the middle region of the organic light-emitting functional layer. Therefore, compared with FIG. 1 and FIG. 2 that the ink climbs along the pixel definition layers around the openings, and the four edges of the organic light-emitting functional layer have thickness differences with the middle portion of the organic light-emitting functional layer, the organic light-emitting display device provided by the embodiment of the present disclosure reduces the thickness difference between the edge of the organic light-emitting functional layer and the middle portion of the organic light-emitting functional layer, the uniformity of the thickness of the organic light-emitting functional layer 23 in the organic light-emitting display device is improved and the display effect of the organic light-emitting display device is improved.

For example, as illustrated in FIG. 3, the at least one insulation portion 232 and the plurality of pixel definition strips 21 are made of different materials. For example, none of the plurality of pixel definition strips 21 extend to be between two adjacent sub organic light-emitting functional layers 231 which are arranged along the extension direction of the pixel definition strips 21 and arranged in the same pixel definition groove 22.

For example, as illustrated in FIG. 3, among the plurality of pixel definition strips 21, distances between the two adjacent pixel definition strips 21 are equal to each other, that is, a distance between two adjacent pixel definition strips 21 is equal to a distance between another two adjacent pixel definition strips 21, it is also that the plurality of pixel definition strips 21 are arranged with an equal interval, and widths of the pixel definition groove 22 are equal to each other, so that distances between two adjacent sub organic light-emitting functional layers 231 are equal to each other in the direction perpendicular to the extension direction of the pixel definition strips 21. Of course, according to requirements, the plurality of pixel definition strips 21 may also be arranged with unequal intervals, that is to say, the widths of the pixel definition grooves 22 are not equal to each other.

For example, as illustrated in FIG. 3, the organic light-emitting display device comprises a plurality of sub-pixels 27 arranged in a matrix, and the pixel definition groove 22 corresponds to a row of the sub-pixels or a column of the sub-pixels (that is, the pixel definition groove 22 only extends in a row direction of the sub-pixels or the pixel definition groove 22 only extends in a column direction of the sub-pixels), each of the plurality of sub organic light-emitting functional layers 231 corresponds to one of the sub-pixels 27.

For example, the substrate 20 may only include a base substrate without any components formed thereon, and the base substrate is a transparent glass substrate or a transparent plastic substrate. For example, the substrate may also be an array substrate provided with a thin film transistor.

Figure 4:
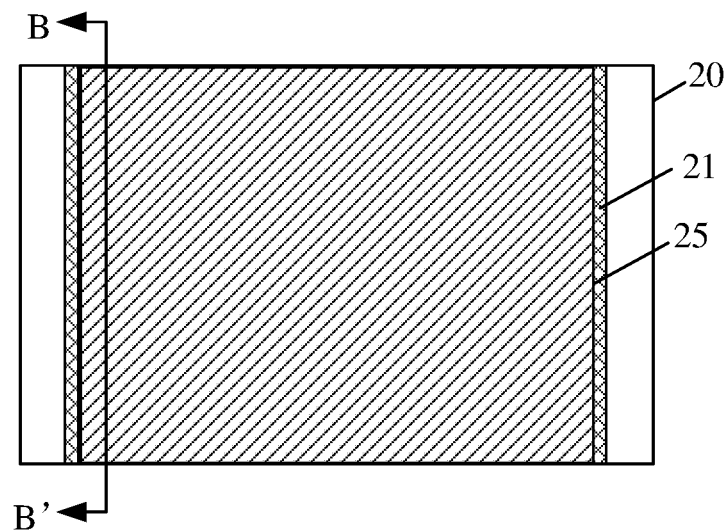
FIG. 4 is another schematic diagram of the plane structure of the organic light-emitting display device provided by at least one embodiment of the present disclosure.
Figure 5:
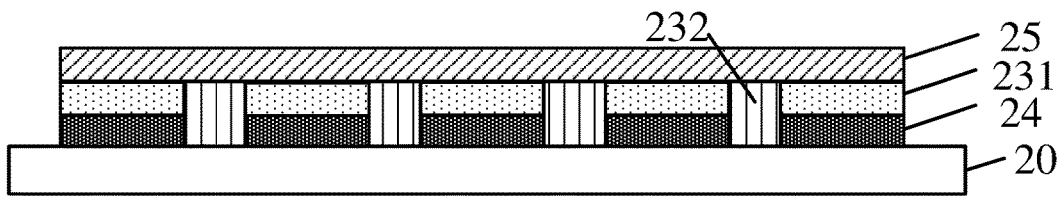
FIG. 5 is a schematic diagram of a sectional structure of the organic light-emitting display device provided by at least one embodiment of the present disclosure.

For example, FIG. 4 is a schematic diagram of another plane structure of the organic light-emitting display device provided by at least one embodiment of the present disclosure, and FIG. 5 is a schematic diagram of a sectional structure of the organic light-emitting display device provided by at least one embodiment of the present disclosure. Combining FIG. 4 with FIG. 5, a plurality of first electrodes 24 which are spaced apart from each other and arranged along the extension direction of the plurality of pixel definition strips 21 are disposed in the pixel definition groove 22, and the plurality of first electrodes 24 are arranged between the substrate 20 and the organic light-emitting functional layer 23.

For example, among the plurality of first electrodes 24, distances between two adjacent first electrodes 24 along the extension direction of the plurality of pixel definition strips 21 are equal to each other or not equal to each other.

For example, the plurality of first electrodes 24 correspond with the plurality of sub organic light-emitting functional layers 231 in a one-to-one manner, that is, only one sub organic light-emitting functional layer 231 is arranged on an upper surface of one first electrode 24. For example, the insulation portion 232 is arranged in an area between adjacent first electrodes 24.

For example, in each of the pixel definition grooves 22, a plurality of first electrodes 24 which are spaced apart from each other and arranged along the extension direction of the plurality of pixel definition strips 21 are formed. In a case that ink is sprayed into each of the pixel definition grooves 22 by ink-jet printing to form the organic light-emitting functional layers 23 covering the first electrodes 24, the ink injected into the pixel definition groove only climb along the pixel definition strips on both sides of the pixel definition groove. Therefore, in the formed organic light-emitting functional layer, only the edge of the organic light-emitting functional layer parallel to the extension direction of the plurality of pixel definition strips has a thickness difference with the middle region of the organic light-emitting functional layer, in this way, after the organic light-emitting functional layer is formed, only the edge of the sub organic light-emitting functional layer parallel to the extension direction of the plurality of pixel definition strips has a thickness difference with the middle region of the sub organic light-emitting functional layer, and the thickness of the edge of the sub organic light-emitting functional layer perpendicular to the extension direction of the plurality of pixel definition strips is the same as the thickness of the middle region of the sub organic light-emitting functional layer.

For example, as illustrated in FIG. 5, the organic light-emitting display device further comprises a second electrode 25 disposed on the plurality of sub organic light-emitting functional layers 231, and the second electrode 25 is shared by the plurality of sub organic light-emitting functional layers 231.

For example, the second electrode 25 is a plate electrode, that is, the second electrode 25 is an entire layer, and the second electrode 25 corresponds to all of the first electrodes 24.

For example, one of the first electrode 24 and second electrode 25 is an anode, and the other one is a cathode. An electrode material used as an anode consists of transparent conductive materials, such as indium tin oxide, Zinc Oxide, etc.; an electrode material used as the cathode includes aluminum, magnesium, or alloy materials made of aluminum and magnesium.

For example, the organic light-emitting functional layer 231 includes an organic light-emitting layer. The organic light-emitting layer comprises a first light-emitting unit, a second light-emitting unit and a third light-emitting unit. Here, for example, the first light-emitting unit is formed by a red light-emitting material, the second light-emitting unit is formed by a green light-emitting material, and the third light-emitting unit is formed by a blue light-emitting material.

For example, organic light-emitting materials in the embodiment of the present disclosure comprise fluorescent light-emitting materials or phosphorescence light-emitting materials, and at present an adopt-mixed system is usually used, that is the usable light-emitting materials are obtained by adding the doping materials to the main light-emitting materials. For example, the metal complex materials, the derivatives of anthracene, aromatic diamine compounds, triphenylamine compounds, aromatic triamine compounds, biphenyl diamine derivatives, or triarylamines polymers, etc are used as the main light-emitting materials, such as, double (2-methyl-8-hydroxyquinoline-N1,O8)-(1,1'-biphenyl-4-hydroxy aluminium (Balq), 9,10- di(2-naphthyl) anthracene (ADN), TAZ, 4,4'-di(9-carbazole) biphenyl (CBP), MCP, 4,4',4'-tri(9-carbazole base) triphenylamine (TCTA) or N, N-double (alpha-naphthyl-phenyl)-4, 4-biphenyl diamine (NPB), etc. The fluorescent light-emitting materials or the mixed materials, for example, comprise coumarin dyes (coumarin 6, C-545-t), quinacridone (DMQA), or 4-(dinitrile methylene)-2-methyl-6-(4-dimethylamino-styrene)-4H-pyran (DCM) series, etc. The phosphorescence light-emitting materials or the doped materials, for example, comprise the metal complex luminescence materials based on the Ir, Pt, Ru, Cu metal, etc, such as, FIrpic, Fir6, FirN4, FIrtaz, Ir(ppy)3, Ir(ppy)2(acac), PtOEP, (btp)2Iracac, Ir(piq) 2(acac) or (MDQ)2Iracac and so on. Besides, the light-emitting materials for example includes the double main body and doping material, or red light-emitting polymer materials, green light-emitting polymer materials, blue light-emitting polymer materials (such as (p-phenylenevinylene), PPV) and so on.

For instance, the red light-emitting material comprises 4,4'-bis (N-carbazole)-1,1'-biphenyl doped with 5,6,11,12-tetraphenylnaphthacene, according to a mass percentage, the ratio of 4,4'-bis (N-carbazole)-1,1'-biphenyl to 5,6,11,12-tetraphenylnaphthacene is 97:3.

For instance, the green light-emitting layer comprises 1,3,5-tris(bromomethyl) benzene doped with N, N'-dimethylquinacridone, according to a mass percentage, the ratio of 1,3,5-tris(bromomethyl) benzene to N, N'-dimethylquinacridone is 85:15.

For instance, the blue light-emitting layer comprises 3-tert-butyl-9,10-bis(2-naphthalene)anthracene doped with 2,5,8,11-tetra-tert-butylperylene, according to a mass percentage, the ratio of 3-tert-butyl-9,10-bis(2-naphthalene) anthracene to 2,5,8,11-tetra-tert-butylperylene is 95:5.

For instance, in order to improve the luminous efficiency of the organic light-emitting display device effectively, the organic light-emitting functional layer further comprises a hole transport layer and an electron transport layer, the first electrode 24 is taken as the anode, and the hole transport layer is disposed between the first electrode 24 and the organic light-emitting layer; the second electrode 25 is taken as the cathode, the electron transport layer is disposed between the second electrode 25 and the organic light-emitting layer.

For instance, the thickness of the hole transport layer is from 10 nm to 180 nm; and the thickness of the electron transport layer is from 10 nm to 35 nm.

For instance, the organic light-emitting functional layer further comprises an electron injection layer disposed between the second electrode 25 and the electron transport layer, and a hole injection layer disposed between the first electrode 24 and the hole transport layer.

For instance, the thickness of the hole injection layer is from 10 nm to 180 nm; and the thickness of the electron injection layer is from 1 nm to 5 nm.

For instance, the material of the hole injection layer comprises any one or any combination of poly(3,4-ethylenedioxythiophene)-polystyrolsulfon acid (PEDOT/PSS), polythiophene and polyaniline The material of the hole injection layer further comprises tri[4-(5-phenyl-2-thiophene) phenyl] amine, 4,4',4"-tri[2-naphthyl (phenyl) amino] triphenylamine (2-TNATA), 4,4' ,4"-tri(3-methyl phenyl aniline) triphenylamine (m-MTDATA), copper phthalocyanine (CuPc), or TPD.

For instance, the material of the electron injection layer comprises any one or any combination of LiF and 8-hydroxyquinoline-lithium. The electron injection layer for example may be made of alkali metal oxides, alkali metal fluorides, etc. The alkali metal oxides include lithium oxide ($Li_2O$), lithium boron oxide (LiBO), potassium silicate ($K_2SiO_3$), cesium carbonate ($Cs_2CO_3$), etc. The alkali metal fluorides include sodium fluoride (NaF), etc.

It should be noted that, in a case that an organic light-emitting functional film is irradiated by ultraviolet light, a portion of an organic light-emitting film, a portion of a hole transport film, a portion of an electron transport film, a portion of a hole injection film and a portion of an electron injection film irradiated by ultraviolet light are modified by ultraviolet light, which lose luminous property, lose hole transport property, lose electron transport property, lose the function of generating cavitation and lose the function of generating electrons respectively, the portions lose the above functions respectively are called as insulation portions.

Figure 6:
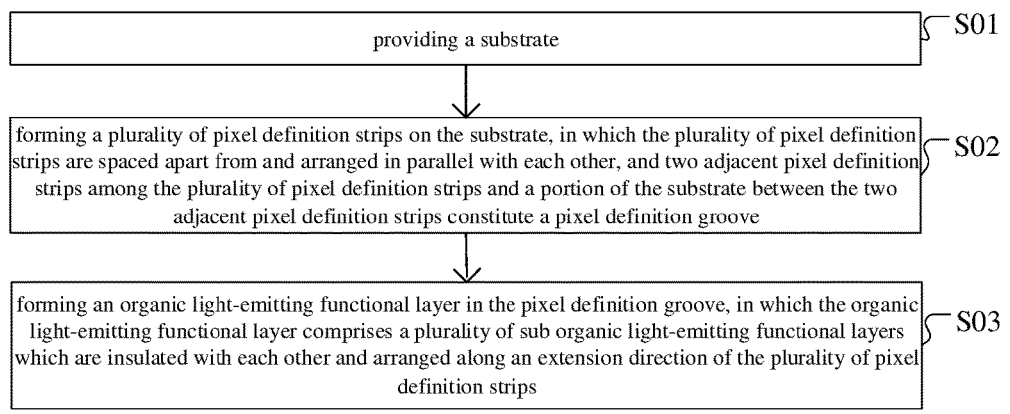
FIG. 6 is a flow diagram of a method for manufacturing an organic light-emitting display device provided by at least one embodiment of the present disclosure.

At least one embodiment of the present disclosure further provides method for manufacturing an organic light-emitting display device, for example, FIG. 6 is a flow diagram of a method for manufacturing an organic light-emitting display device provided by at least one embodiment of the present disclosure. As illustrated in FIG. 6, the method for manufacturing the organic light-emitting display device comprises:

Step S01: providing a substrate.

For instance, the substrate is a thin film transistor (TFT) array substrate, or other substrates, or only a base substrate without any components formed thereon.

Step S02: forming a plurality of pixel definition strips on the substrate, in which the plurality of pixel definition strips are spaced apart from and arranged in parallel with each other, and two adjacent pixel definition strips among the plurality of pixel definition strips and a portion of the substrate between the two adjacent pixel definition strips constitute a pixel definition groove.

For example, a hydrophilic material or a hydrophobic material is used to form the plurality of pixel definition strips, the hydrophilic material includes inorganic hydrophilic material or organic hydrophilic material, and the inorganic hydrophilic material includes at least one of the $SiO_2$, $SiN_x$, or $SiON_x$, and the organic hydrophilic material includes at least one of polyimide, polymethylpropene acid methyl esters and organosilicon resins; the hydrophobic material includes at least one of fluorinated polyimides, fluorinated polymethyl methacrylate and fluorinated organosilicon.

For example, shapes of cross sections of the plurality of pixel definition strips are regular shapes such as trapezoid, parallelogram, etc, or other irregular polygons.

Step S03: forming an organic light-emitting functional layer in the pixel definition groove, in which the organic light-emitting functional layer comprises a plurality of sub organic light-emitting functional layers which are insulated with each other and arranged along an extension direction of the plurality of pixel definition strips.

For example, the organic light-emitting functional layer comprises the plurality of sub organic light-emitting functional layers and at least one insulation portion which are alternately arranged along the extension direction of the plurality of pixel definition strips. For example, there are a plurality of insulation portions, and the plurality of sub organic light-emitting functional layers are insulated with each other by the plurality of insulation portions. That is, the plurality of insulation portions spaced apart from each other in the organic light-emitting functional layer separate the plurality of sub organic light-emitting functional layers from each other, to form light-emitting areas which are spaced apart from each other.

For example, both the initial material of the plurality of sub organic light-emitting functional layers and the initial material of the at least one insulation portion are a same organic light-emitting functional material. The formation process of the plurality of sub organic light-emitting functional layers and the at least one insulation portion is: forming an organic light-emitting functional film in the pixel definition groove, and then modifying a portion of the organic light-emitting functional film. For example, the modification includes illuminating the portion of the organic light-emitting functional film by ultraviolet light to form the at least one insulation portion.

Figure 7:
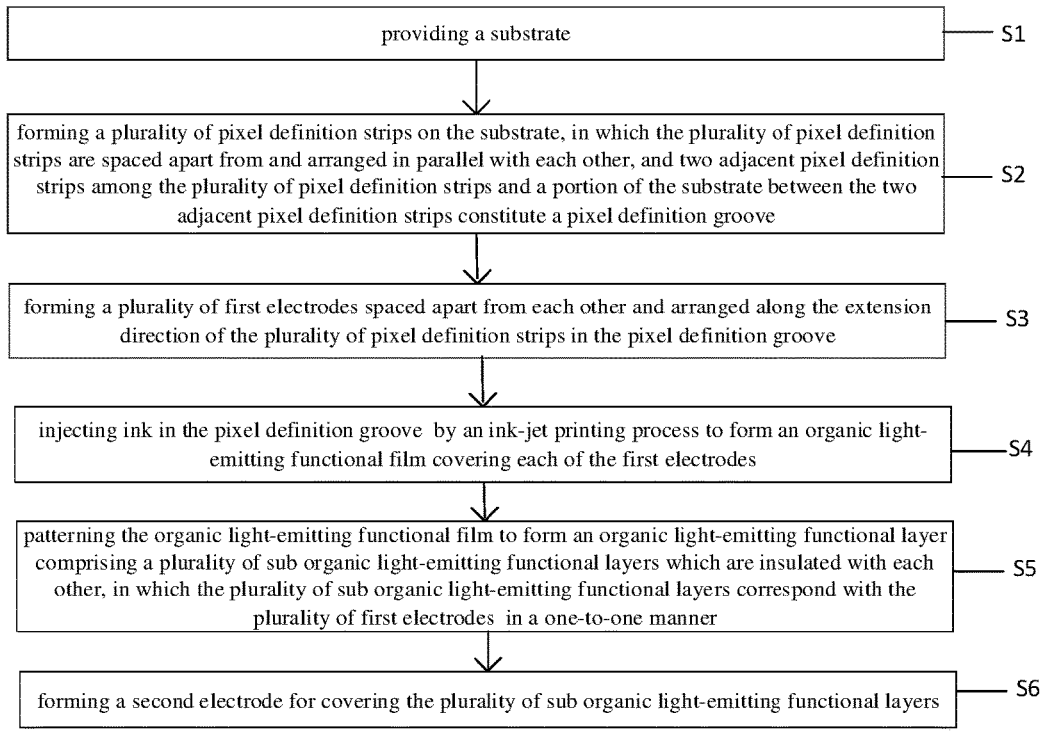
FIG. 7 is another flow diagram of the method for manufacturing the organic light-emitting display device provided by at least one embodiment of the present disclosure.

FIG. 7 is a flow diagram of a method for manufacturing an organic light-emitting display device provided by at least one embodiment of the present disclosure. As illustrated in FIG. 7, the method for manufacturing the organic light-emitting display device comprises:

Step S1: providing a substrate.

For example, the related features of the substrate can refer to the relevant descriptions described above, and detailed descriptions will be omitted herein.

Step S2: forming a plurality of pixel definition strips on the substrate, in which the plurality of pixel definition strips are spaced apart from and arranged in parallel with each other, and two adjacent pixel definition strips among the plurality of pixel definition strips and a portion of the substrate between the two adjacent pixel definition strips constitute a pixel definition groove.

For example, the related features of the substrate can refer to the relevant descriptions described above, and detailed descriptions will be omitted herein.

Figure 8:
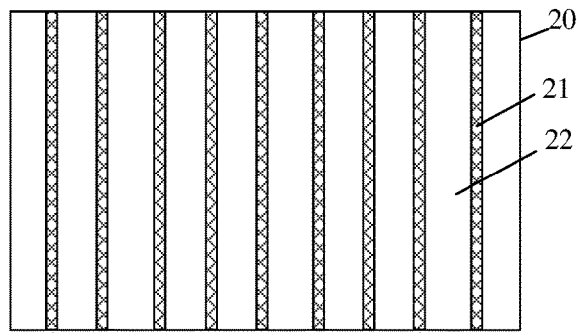
FIG. 8 is a schematic diagram of a plane structure of the structure after the step S2 in FIG. 7 has finished.

After the step S2 is finished, a structure as shown in FIG. 8 is formed. As illustrated in FIG. 8, the plurality of pixel definition strips 21 on a surface of the substrate 20 are spaced apart from and arranged in parallel with each other, and two adjacent pixel definition strips 21 among the plurality of pixel definition strips 21 and a portion of the substrate 20 between the two adjacent pixel definition strips 21 constitute a pixel definition groove 22.

For example, a distance between two adjacent pixel definition strips 21 is equal to a distance between another two adjacent pixel definition strips 21, that is: the plurality of pixel definition strips 21 are arranged with an equal interval. Of course, according to requirement, the plurality of pixel definition strips 21 may also be arranged with unequal intervals, it can be designed according to requirements.

Step S3: forming a plurality of first electrodes spaced apart from each other and arranged along the extension direction of the plurality of pixel definition strips in the pixel definition groove.

For example, the first electrode is an anode of an organic light-emitting diode. The manufacturing method of the first electrode is: depositing ITO (Indium tin oxide) thin film in the pixel definition groove 22 shown in FIG. 8 firstly, and then patterning the ITO film to form a plurality of first electrodes 24 spaced apart from each other and arranged along the extension direction of the plurality of pixel definition strips 21.

Figure 9:
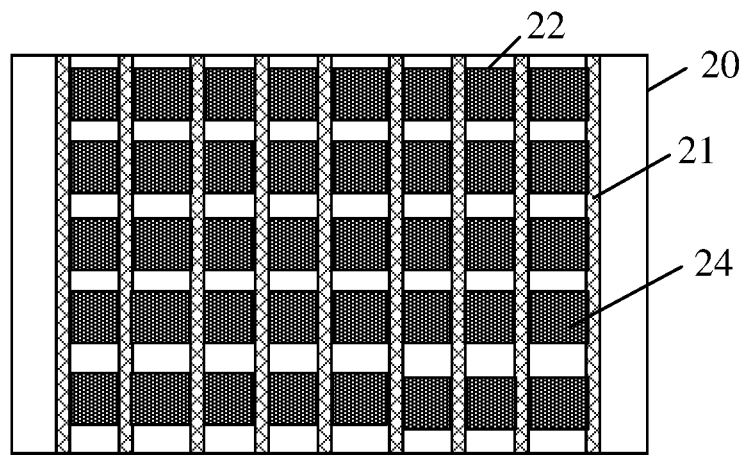
FIG. 9 is a schematic diagram of a plane structure of the structure after the step S3 in FIG. 7 has finished.

After the step S3 is finished, a structure as shown in FIG. 9 is formed on the basis of the structure shown in FIG. 8, the plurality of first electrodes 24 are formed in each of the pixel definition grooves 22, and the plurality of first electrodes 24 are arranged in a row along the extension direction of the pixel definition strips 21.

For example, the materials of the first electrode include transparent conductive materials such as indium tin oxide and zinc oxide.

Step S4: injecting ink in the pixel definition groove by an ink-jet printing process to form an organic light-emitting functional film covering each of the first electrodes.

In this step, the ink is related to the characteristics of the organic light-emitting functional layers required to be formed, and the ink is different in a case that the organic light-emitting functional layers have different characteristics, for example, in a case that the organic light-emitting layer is required to be formed, the ink is a solution containing a material of the organic light-emitting layer; in a case that the hole injection layer or the hole transport layer is required to be formed, the ink is a solution containing a material of the hole injection layer or a solution containing a material of the hole transport layer.

Figure 10:
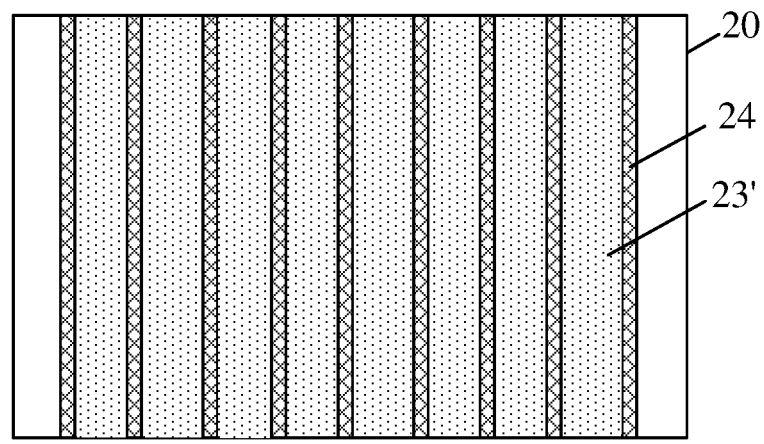
FIG. 10 is a schematic diagram of a plane structure of the structure after the step S4 in FIG. 7 has finished.

After the step S4 is finished, a structure as shown in FIG. 10 is formed on the basis of the structure shown in FIG. 9, in the structure, the organic light-emitting functional film 23' covering each of the first electrodes 24 (not shown) is formed in each of the pixel definition grooves 22.

For example, the organic light-emitting functional film 23' includes an organic light-emitting film, and correspondingly, the ink sprayed into each of the pixel definition grooves 22 contains the material of the organic light-emitting layer. For example, the material of the organic light-emitting layer can refer to the relevant descriptions described above, and detailed descriptions will be omitted herein.

For example, on the basis that the organic light-emitting functional film 23' includes the organic light-emitting film, the organic light-emitting functional film 23' further includes the hole injection film arranged between the first electrode and the organic light-emitting film, and the hole transport film arranged between the hole injection film and the organic light-emitting film.

For example, in the step S4, injecting ink in the pixel definition groove 22 by an ink-jet printing process to form the organic light-emitting functional film 23' covering each of the first electrodes 24 comprises the following operations.

Injecting ink comprising the material of the hole injection layer in the pixel definition groove 22 by an ink-jet printing process, to form the hole injection film covering the first electrode 24. For example, the material of the hole injection layer refers to the relevant descriptions described above, and PEDOT (3,4-ethylene two oxygen thiophene monomer): PSS (polystyrene sulfonate) particle ink is also used as the material of the hole injection layer.

Injecting ink comprising the material of the hole transport layer on the hole injection film by an ink-jet printing process, to form the hole transport film covering the hole injection film. For example, the material of the hole transport layer is triphenylamine compounds and so on.

Injecting ink comprising the material of the organic light-emitting layer on the hole transport film by an ink-jet printing process, to form the organic light-emitting film covering the hole transport film.

For example, after the organic light-emitting film covering the hole transport film is formed, the method for manufacturing the organic light-emitting display device further comprises the following operations.

Forming the electron transport film covering the organic light-emitting film on the organic light-emitting film.

Forming the electron injection film covering the electron transport film on the electron transport film. For example, an evaporation method is used to form the electron transport film on the organic light-emitting film, and the electron injection film on the electron transport film. For example, a material of the electron injection layer refers to the relevant descriptions described above.

Step S5: patterning the organic light-emitting functional film to form an organic light-emitting functional layer comprising a plurality of sub organic light-emitting functional layers which are insulated with each other, in which the plurality of sub organic light-emitting functional layers correspond with the plurality of first electrodes in a one-to-one manner.

Figure 11:
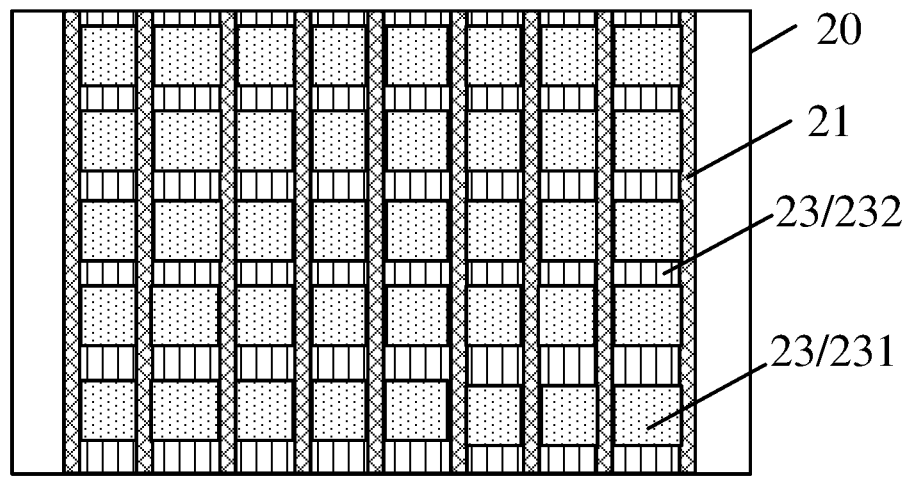
FIG. 11 is a schematic diagram of a plane structure of the structure after the step S5 in FIG. 7 has finished.

After the step S5 is finished, a structure as shown in FIG. 11 is formed on the basis of the structure shown in FIG. 10. As illustrated in FIG. 11, the plurality of sub organic light-emitting functional layers 231 of the organic light-emitting functional layer 23 are connected with each other, but the plurality of sub organic light-emitting functional layers are only physical connected and are not electrically connected, that is, the plurality of sub organic light-emitting functional layers 231 are insulated from each other. In FIG. 11, the organic light-emitting functional layer 23 further comprises a plurality of insulation portions 232, and the plurality of sub organic light-emitting functional layers 231 are spaced apart from each other by the plurality of insulation portions 232.

For example, there are many methods for patterning the organic light-emitting functional film 23' to form the organic light-emitting functional layer 23 comprising the plurality of sub organic light-emitting functional layers 231 which are insulated with each other, the following examples are used to illustrate the implementations.

A mask is used to cover the organic light-emitting functional film 23', and then the mask is irradiated by ultraviolet light to modify the specific region of the organic light-emitting functional film 23'. For example, taking the organic light-emitting film as the organic light-emitting functional film 23' for an example, after the organic light-emitting film 23' being irradiated by ultraviolet light, the specific region of the organic light-emitting film 23' loses its luminous property.

In the embodiment of the present disclosure, the specific region of the organic light-emitting functional film 23' may be a region corresponding to the light transmittance region of the mask, and the specific region of the organic light-emitting functional film 23' is irradiated by the ultraviolet light that pass through the light transmittance region of the mask, so that the specific region of the organic light-emitting functional film 23' is modified, and the organic light-emitting functional layer 23 comprising the plurality of sub organic light-emitting functional layers 231 having luminescent characteristics and insulated from each other is formed, and the plurality of sub organic light-emitting functional layers correspond with the plurality of first electrodes in a one-to-one manner, but the plurality of sub organic light-emitting functional layers are connected by the regions that lose their luminescent property, the plurality of sub organic light-emitting functional layers are only physical connected and are not electrically connected, that is, the plurality of sub organic light-emitting functional layers 231 are insulated from each other.

For example, before forming the at least one insulation portion, that is before illuminating the organic light-emitting functional film by ultraviolet light, the method further comprises: curing the organic light-emitting functional film by a curing process, in which the curing process comprises at least one of a vacuum curing process and a heat curing process.

For example, the organic light-emitting display device comprises a plurality of sub-pixels arranged in a matrix, the pixel definition groove corresponds to a row of the sub-pixels or a column of the sub-pixels, and each of the plurality of sub organic light-emitting functional layers corresponds to one of the sub-pixels. In a same pixel definition groove, the adjacent sub pixels are separated by the insulation portions.

Step S6: forming a second electrode for covering the plurality of sub organic light-emitting functional layers.

Figure 12:
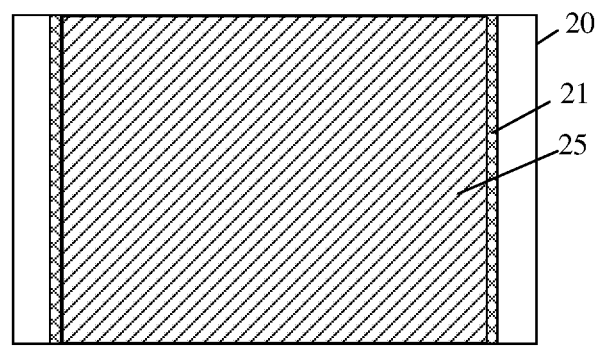
FIG. 12 is a schematic diagram of a plane structure of the structure after the step S6 in FIG. 7 has finished.

After the step S6 is finished, a structure as shown in FIG. 12 is formed on the basis of the structure shown in FIG. 11. As illustrated in FIG. 12, a second electrode 25 for covering the plurality of sub organic light-emitting functional layers 231 is formed. For example, the material of the second electrode includes aluminum, magnesium or the alloy material formed by aluminum and magnesium.

In the method for manufacturing the organic light-emitting display device provided by at least one embodiment of the present disclosure, before ink-jet printing, the plurality of pixel definition strips 21 spaced apart from and arranged in parallel with each other are formed on the base substrate 20, and two adjacent pixel definition strips 21 among the plurality of pixel definition strips 21 and the portion of the substrate 20 between the two adjacent pixel definition strips 21 constitute the pixel definition groove 22, and the plurality of first electrodes 24 which are spaced apart from each other and arranged along the extension direction of the plurality of pixel definition strips 21 are disposed in the pixel definition groove 22. Thus, in a case that ink is sprayed into the pixel definition groove 22 through ink-jet printing to form the organic light-emitting functional film 23' covering each of the first electrodes 24, the ink in the pixel definition groove 22 only climbs along the plurality of pixel definition strips 21 on both sides of the pixel definition groove 22, therefore, in the formed organic light-emitting functional layer 23, only the edge of the organic light-emitting functional layer 23 parallel to the extension direction of the plurality of pixel definition strips 21 has a thickness difference with the middle region of the organic light-emitting functional layer 23, in this way, in the plurality of sub organic light-emitting functional layers 231, only the edge of the sub organic light-emitting functional layer parallel to the extension direction of the plurality of pixel definition strips 21 has a thickness difference with the middle region of the sub organic light-emitting functional layer 231, and the edge of the sub organic light-emitting functional layer 231 perpendicular to the extension direction of the plurality of pixel definition strips 21 has a same thickness as the middle region of the sub organic light-emitting functional layer 231. Therefore, compared with FIG. 1 and FIG. 2 that the ink climbs along the pixel definition layers around the openings and the four edges of the organic light-emitting functional layer have thickness differences with the middle portion of the organic light-emitting functional layer, the organic light-emitting display device provided by the embodiment of the present disclosure reduces the thickness difference between the edge of the organic light-emitting functional layer 23 and the middle portion of the organic light-emitting functional layer 23, the uniformity of the thickness of the organic light-emitting functional layer 23 in the organic light-emitting display device is improved and the display effect of the organic light-emitting display device is improved.

Please note that:

(1) the drawings of the embodiments of the present disclosure are only related to the structures mentioned in the embodiments of the present disclosure, and other structures can be obtained by general designs;

(2) for the sake of clarity, sizes of layers or regions in the drawings for describing the embodiments of the present disclosure are not drawn according to an actual scale but are exaggerated or diminished, it can be understood that, in a case that a component such as a layer, a film, a region, or a substrate is called "on" or "under" another component, the component is "on" or "under" another component directly, or there may be an intermediate component.

(3) the embodiments of the present disclosure and the features therein can be combined with each other in the absence of conflict.

What are described above is related to only the illustrative embodiments of the disclosure and not limitative to the scope of the disclosure. The scopes of the disclosure are defined by the accompanying claims.

What is claimed is:

1. An organic light-emitting display device, comprising:
    a substrate;
    a plurality of pixel definition strips disposed on the substrate, wherein the plurality of pixel definition strips are spaced apart from and arranged in parallel with each other, and two adjacent pixel definition strips among the plurality of pixel definition strips and a portion of the substrate between the two adjacent pixel definition strips constitute a pixel definition groove; and
    an organic light-emitting functional layer disposed in the pixel definition groove, wherein the organic light-emitting functional layer comprises a plurality of sub organic light-emitting functional layers which are insulated with each other and arranged along an extension direction of the plurality of pixel definition strips.

2. The organic light-emitting display device according to claim 1, wherein the organic light-emitting functional layer comprises the plurality of sub organic light-emitting functional layers and at least one insulation portion which are alternately arranged along the extension direction of the plurality of pixel definition strips, and the plurality of sub organic light-emitting functional layers are insulated with each other by the at least one insulation portion.

3. The organic light-emitting display device according to claim 2, wherein the plurality of sub organic light-emitting functional layers and the at least one insulation portion are arranged at a same layer.

4. The organic light-emitting display device according to claim 2, wherein upper surfaces of the plurality of sub organic light-emitting functional layers facing away from the substrate and upper surface of the at least one insulation portion facing away from the substrate are arranged in a same plane.

5. The organic light-emitting display device according to claim 1, wherein among the plurality of pixel definition strips, distances between the two adjacent pixel definition strips are equal to each other or not equal to each other.

6. The organic light-emitting display device according to claim 1, wherein a plurality of first electrodes, which are spaced apart from each other and arranged along the extension direction of the plurality of pixel definition strips, are disposed in the pixel definition groove, and the plurality of first electrodes are arranged between the substrate and the organic light-emitting functional layer.

7. The organic light-emitting display device according to claim 6, wherein among the plurality of first electrodes, distances between two adjacent first electrodes along the extension direction of the plurality of pixel definition strips are equal to each other or not equal to each other.

8. The organic light-emitting display device according to claim 7, wherein the plurality of first electrodes correspond with the plurality of sub organic light-emitting functional layers in a one-to-one manner.

9. The organic light-emitting display device according to claim 8, further comprising: a second electrode disposed on the plurality of sub organic light-emitting functional layers, wherein the second electrode is shared by the plurality of sub organic light-emitting functional layers.

10. The organic light-emitting display device according to claim 2, wherein the at least one insulation portion and the plurality of pixel definition strips are made of different materials.

11. The organic light-emitting display device according to claim 1, comprising a plurality of sub-pixels arranged in a matrix, wherein the pixel definition groove corresponds to a row of the sub-pixels or a column of the sub-pixels, each of the plurality of sub organic light-emitting functional layers corresponds to one of the sub-pixels.

12. A method for manufacturing an organic light-emitting display device, comprising:
    providing a substrate;
    forming a plurality of pixel definition strips on the substrate, wherein the plurality of pixel definition strips are spaced apart from and arranged in parallel with each other; two adjacent pixel definition strips among the plurality of pixel definition strips and a portion of the substrate between the two adjacent pixel definition strips constitute a pixel definition groove; and
    forming an organic light-emitting functional layer in the pixel definition groove, wherein the organic light-emitting functional layer comprises a plurality of sub organic light-emitting functional layers which are insulated with each other and arranged along an extension direction of the plurality of pixel definition strips.

13. The method for manufacturing the organic light-emitting display device according to claim 12, wherein forming the organic light-emitting functional layer comprises:
    forming an organic light-emitting functional film in the pixel definition groove;
    illuminating a first portion of the organic light-emitting functional film by ultraviolet light to form at least one insulation portion, wherein a second portion of the organic light-emitting functional film without being illuminated by the ultraviolet light is the plurality of sub organic light-emitting functional layers.

14. The method for manufacturing the organic light-emitting display device according to claim 13, wherein the organic light-emitting functional layer comprises the plurality of sub organic light-emitting functional layers and the at least one insulation portion which are alternately arranged along the extension direction of the plurality of pixel definition strips, and the plurality of sub organic light-emitting functional layers are insulated with each other by the at least one insulation portion.

15. The method for manufacturing the organic light-emitting display device according to claim 14, before forming the organic light-emitting functional layer, further comprising: forming a plurality of first electrodes spaced apart from each other and arranged along the extension direction of the plurality of pixel definition strips in the pixel definition groove.

16. The method for manufacturing the organic light-emitting display device according to claim 15, wherein the plurality of first electrodes correspond with the plurality of sub organic light-emitting functional layers in a one-to-one manner.

17. The method for manufacturing the organic light-emitting display device according to claim 16, wherein the organic light-emitting functional layer comprises an organic light-emitting layer, forming the organic light-emitting layer comprises: injecting ink comprising a material of the organic light-emitting layer in the pixel definition groove by an ink-jet printing process.

18. The method for manufacturing the organic light-emitting display device according to claim 13, before forming the at least one insulation portion, further comprising: curing the organic light-emitting functional film by a curing process, wherein the curing process comprises a vacuum curing process and/or a heat curing process.

19. The method for manufacturing the organic light-emitting display device according to claim 12, wherein the organic light-emitting display device comprises a plurality of sub-pixels arranged in a matrix, the pixel definition groove corresponds to a row of the sub-pixels or a column of the sub-pixels, and each of the plurality of sub organic light-emitting functional layers corresponds to one of the sub-pixels.

20. The method for manufacturing the organic light-emitting display device according to claim 18, further comprising: forming a second electrode for covering the plurality of sub organic light-emitting functional layers, wherein the second electrode is shared by the plurality of sub organic light-emitting functional layers.

* * * * *